US007928451B2

(12) United States Patent
Bilenko et al.

(10) Patent No.: US 7,928,451 B2
(45) Date of Patent: Apr. 19, 2011

(54) SHAPED CONTACT LAYER FOR LIGHT EMITTING HETEROSTRUCTURE

(75) Inventors: Yuriy Bilenko, Columbia, SC (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 707 days.

(21) Appl. No.: 11/626,999

(22) Filed: Jan. 25, 2007

(65) Prior Publication Data

US 2008/0042148 A1   Feb. 21, 2008

Related U.S. Application Data

(60) Provisional application No. 60/838,685, filed on Aug. 18, 2006.

(51) Int. Cl.
*H01L 33/00* (2010.01)
(52) U.S. Cl. ........ 257/91; 257/79; 257/94; 257/E33.065
(58) Field of Classification Search ............ 257/79, 257/91, 94, E33.065
See application file for complete search history.

(56) References Cited

U.S. PATENT DOCUMENTS

| 6,307,218 B1 | 10/2001 | Steigerwald et al. |
| 2003/0047743 A1 | 3/2003 | Li |
| 2005/0133806 A1 | 6/2005 | Peng et al. |
| 2006/0046328 A1 * | 3/2006 | Raffetto et al. ............... 438/21 |
| 2006/0289881 A1 | 12/2006 | Chen et al. |

OTHER PUBLICATIONS

PCT International Search Report and Written Opinion, Jul. 11, 2008, 9 pages.

* cited by examiner

*Primary Examiner* — Kiesha R Bryant
*Assistant Examiner* — Minchul Yang
(74) *Attorney, Agent, or Firm* — John W. LaBatt; Hoffman Warnick LLC

(57) ABSTRACT

An improved light emitting heterostructure and/or device is provided, which includes a contact layer having a contact shape comprising one of: a clover shape with at least a third order axis of symmetry or an H-shape. The use of these shapes can provide one or more improved operating characteristics for the light emitting devices. The contact shapes can be used, for example, with contact layers on nitride-based devices that emit light having a wavelength in at least one of: the blue spectrum or the deep ultraviolet (UV) spectrum.

16 Claims, 4 Drawing Sheets

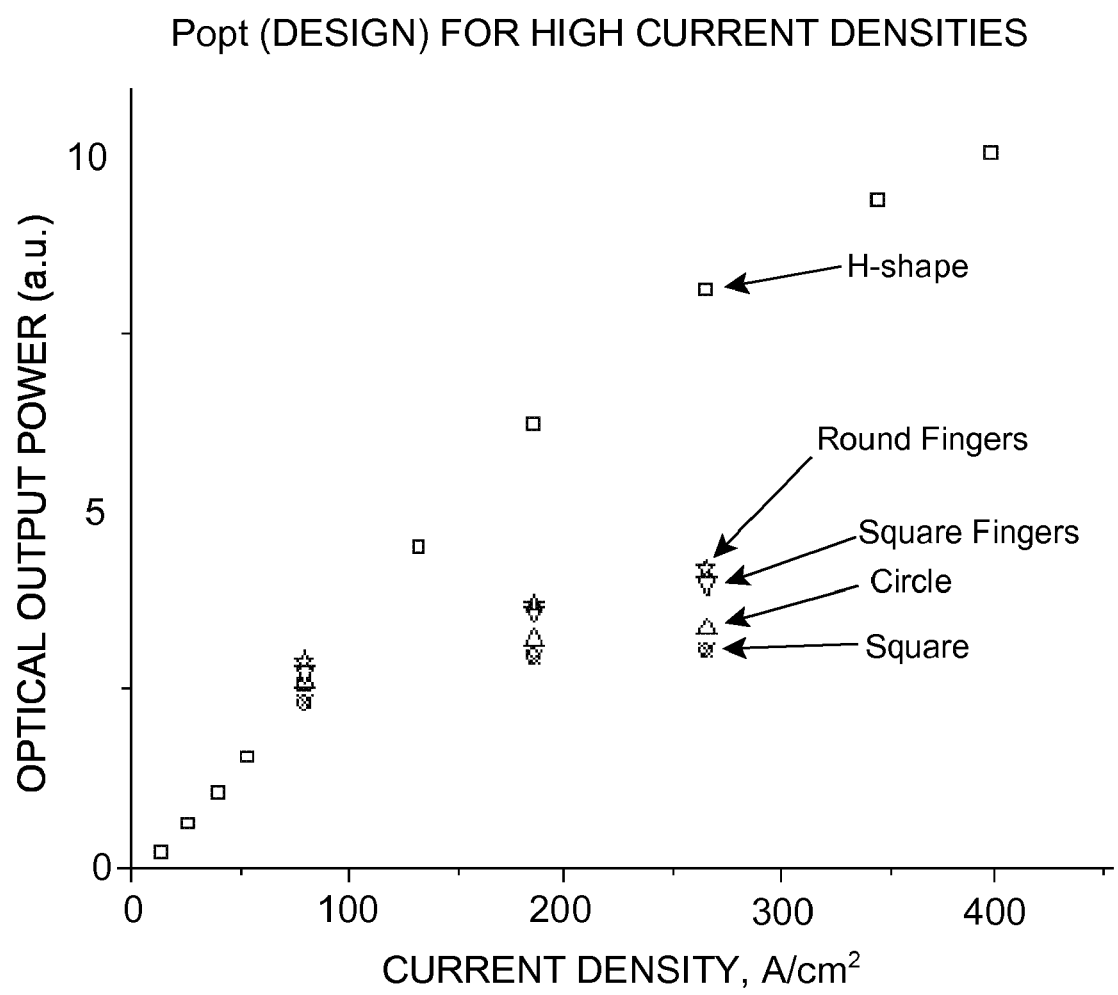

SHAPED CONTACT LAYER FOR LIGHT EMITTING HETEROSTRUCTURE

REFERENCE TO PRIOR APPLICATION

The current application claims the benefit of co-pending U.S. Provisional Application No. 60/838,685, filed on 18 Aug. 2006, which is hereby incorporated herein by reference.

BACKGROUND OF THE INVENTION

1. Technical Field

Aspects of the invention relate generally to light emitting devices, and more specifically, to a shaped contact layer for a light emitting device.

2. Background Art

Recently, a great deal of interest is focused on nitride-based light emitting diodes (LEDs) and lasers that emit light in the blue and deep ultraviolet (UV) wavelengths. These light emitting devices may be capable of being incorporated into various applications, including solid-state lighting, biochemical detection, high-density data storage, and the like. However, to date, the performance of nitride-based light emitting diodes and lasers quickly worsens as the radiation wavelength is reduced into the ultraviolet range.

For example, an Aluminum (Al)-Gallium (Ga)-Nitrogen (N)-based UV LED includes an n-type AlGaN contact layer for which the current flow is lateral. For short wavelength light emitting devices, a molar fraction of Al in the AlGaN contact layer is increased to provide a low absorption of the UV light emitted by the device. However, contact layers having a high Al molar fraction tend to have a much higher resistivity, thereby resulting in a high resistance for the contact layer and current crowding. As a result, the device will tend to have a non-uniform distribution of light.

A characteristic current crowding length, $L_{cr}$, for a UV LED can be estimated as $$L_{cr} = \frac{qIR_{sq}}{\eta k_B TW},$$

where q is the electron charge, I is the device current in Amperes; $R_{sq}$ is the resistance of the lateral contact layer in ohms per square (Ohm*$m^2$); f is the diode ideality factor; $k_B$ is the Boltzmann constant, $k_B$=1.38×$10^{-23}$ J/K; T is the diode operating (junction) temperature in degrees Kelvin; and W is the contact periphery in meters. An estimate for $L_{cr}$ can be obtained based on an assumed uniform current distribution along a perimeter of the LED.

An approach seeks to decrease the effect of current crowding in an LED by manufacturing the LED so that a distance from the metal contact to the center of the LED is smaller than or comparable to $L_{cr}$. Using this approach, a long "stripe" LED is the most efficient shape. However, such an LED does not provide a practical beam shape and is not conducive to LED packaging solutions. A more conventional circular shape for the LED has the smallest active light emitting area for a given device perimeter, W. Additionally, the circular shape is not optimal for flip chip packaging of the LED.

In view of the foregoing, a need exists to overcome one or more of the deficiencies in the related art.

SUMMARY OF THE INVENTION

Aspects of the invention provide an improved light emitting heterostructure and/or device, which includes a contact layer having a contact shape comprising one of: a clover shape with at least a third order axis of symmetry or an H-shape. The use of these shapes can provide one or more improved operating characteristics for the light emitting devices. The contact shapes can be used, for example, with contact layers on nitride-based devices that emit light having a wavelength in at least one of: the blue spectrum or the deep ultraviolet (UV) spectrum.

A first aspect of the invention provides a light emitting heterostructure comprising: a light generating structure; and a contact layer over the light generating structure, the contact layer having a contact shape comprising one of: a clover shape with at least a third order axis of symmetry or an H-shape.

A second aspect of the invention provides a light emitting device comprising: a light generating structure; and a contact layer over the light generating structure, the contact layer having a clover shape with an axis of symmetry of at least the third order.

A third aspect of the invention provides a light emitting device comprising: a light generating structure; and a contact layer over the light generating structure, the contact layer having an H-shape.

A fourth aspect of the invention provides a method of manufacturing a light emitting heterostructure, the method comprising: obtaining a light generating structure; and forming a contact layer over the light generating structure, the contact layer having a contact shape comprising one of: a clover shape with at least a third order axis of symmetry or an H-shape.

A fifth aspect of the invention provides a method of manufacturing a light emitting device, the method comprising: obtaining a light generating structure; and forming a contact layer over the light generating structure, the contact layer having a clover shape with an axis of symmetry of at least the third order.

A sixth aspect of the invention provides a method of manufacturing a light emitting device, the method comprising: obtaining a light generating structure; and forming a contact layer over the light generating structure, the contact layer having an H-shape.

The illustrative aspects of the invention are designed to solve one or more of the problems herein described and/or one or more other problems not discussed.

BRIEF DESCRIPTION OF THE DRAWINGS

These and other features of the invention will be more readily understood from the following detailed description of the various aspects of the invention taken in conjunction with the accompanying drawings that depict various embodiments of the invention.

FIG. 4 shows a chart of power-current density characteristics for illustrative light emitting devices having different contact geometries.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide an improved light emitting heterostructure and/or device, which includes a contact layer having a contact shape comprising one of: a clover shape with at least a third order axis of symmetry or an H-shape. The use of these shapes can provide one or more improved operating characteristics for the light emitting devices. The contact shapes can be used, for example, with contact layers on nitride-based devices that emit light having a wavelength in at least one of: the blue spectrum or the deep ultraviolet (UV) spectrum. As used herein, unless otherwise noted, the phrase "any solution" means any now known or later developed solution.

Figure 1:
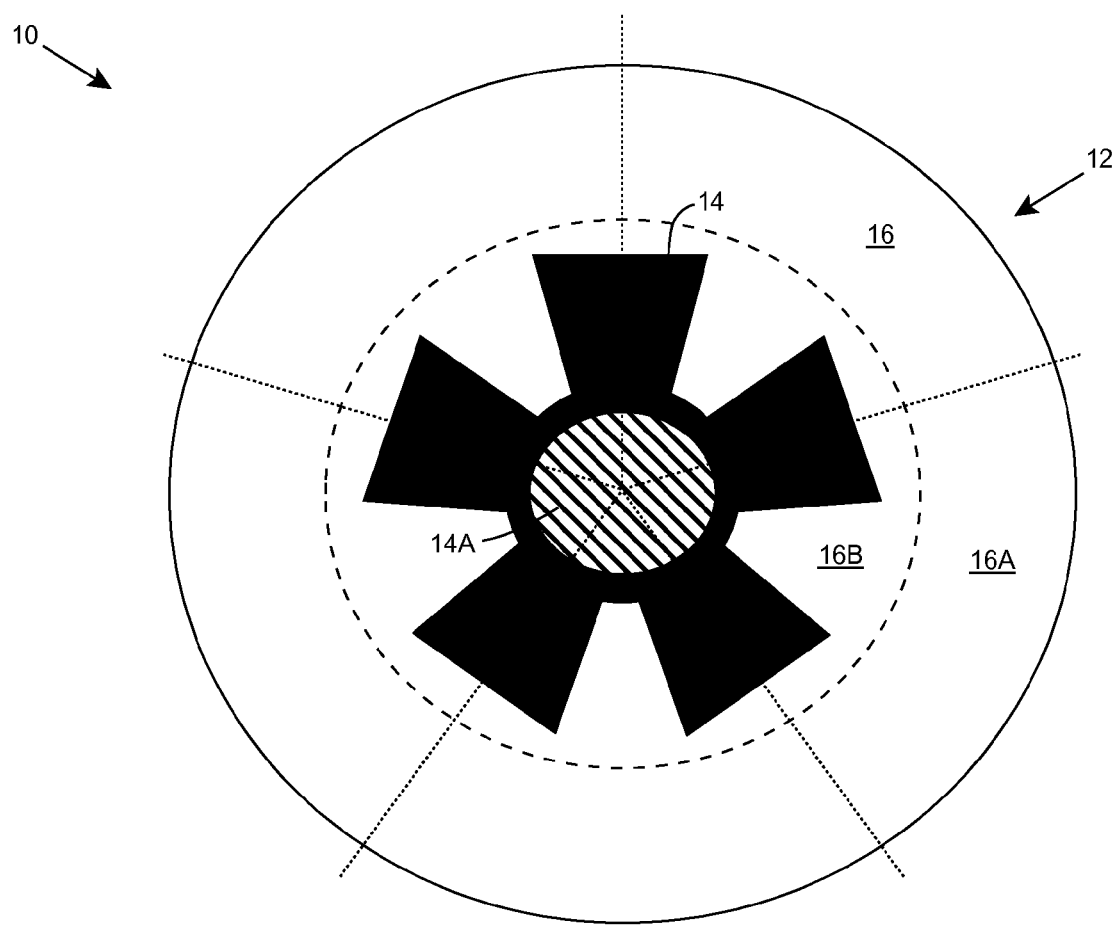
FIG. 1 shows an illustrative light emitting heterostructure according to an embodiment of the invention.

Turning to the drawings, FIG. 1 shows an illustrative light emitting heterostructure 10 according to an embodiment of the invention. Light emitting heterostructure 10 includes a light generating structure 12 and a contact layer 14 deposited on light generating structure 12. Light generating structure 12 is shown having a substantially circular shape, while contact layer 14 is shown having a clover shape. With this configuration, heterostructure 10 provides several advantages over other light emitting heterostructure and/or device configurations. For example, the clover shape of contact layer 14 can provide a more uniform current distribution under the active area than previous circular light emitting devices, while maintaining a similar shape as the previous circular devices.

To this extent, contact layer 14 has some symmetry, but has a lower symmetry than a circular shape. In an embodiment of the invention, contact layer 14 has a rotational axis of symmetry that is at least the third order. In particular, contact layer 14 is substantially symmetrical when rotated by $2\pi/n$ radians, where $n \geq 3$ (e.g., rotation by $2\pi/3$, $2\pi/4$, $2\pi/5$, $2\pi/6$, etc.). As illustrated by the dashed lines, contact layer 14 has an axis of symmetry that comprises the fifth order, e.g., contact layer 14 is symmetrical when rotated every $2\pi/5$ radians. The clover shape of contact layer 14 includes a central portion (e.g., substantially circular), with a plurality of fingers extending therefrom. Each finger extends along a symmetrical direction, thereby forming the clover-like shape. The dimension of each finger can be selected based on a total area of the light generating structure 12. For example, the dimensions can be selected to provide a maximum possible filling factor for the LED die (e.g., a ratio of an area of the p-contact to an area of the total die) with proper heat sink and electrical contact.

It is understood that contact layer 14 may not be perfectly symmetrical. To this extent, a shape of one or more fingers in contact layer 14 can be deformed/altered. For example, a finger can be deformed to assist in attaching a metal extension, such as a contact, a heat sink, or the like, to contact layer 14 using any solution. Similarly, the clover shape (e.g., one or more fingers and/or the central portion of contact layer 14) can be deformed to accommodate additional packaging of heterostructure 10 for operation as a light emitting device, and/or the like. Further, while each finger is shown having pointed corners, it is understood that one or more corners on one or more fingers can be rounded or the like, e.g., to limit any excessive electrical field, provide more uniform field and/or current density distributions over contact layer 14, and/or the like. The thickness of the fingers of contact layer 14 can vary between relatively thick fingers, providing a nearly circular or rectangular contact layer 14 with small spacing between fingers, to fingers with an average finger width ($w_p$) much less than an average spacing between the fingers ($w_s$), i.e., $w_p \ll w_s$.

Light generating structure 12 is shown including a top layer 16 on which contact layer 14 is grown/deposited. In one embodiment, top layer 16 comprises an n-type nitride-based composition, while contact layer 14 comprises a p-type nitride-based composition. The layer compositions can be selected based on a desired wavelength of the light generated by light generating structure 12. For example, a molar fraction of Aluminum can be increased for a light generating structure 12 that generates light having a shorter wavelength. In any event, top layer 16 can include a raised portion 16A (e.g., a bump) and a lower portion 16B on which contact layer 14 is disposed (respectively distinguished by the dashed circle). Further, contact layer 14 can include a raised portion 14A indicated by the striped area. Raised portions 14A, 16A can assist in connecting heterostructure 10, and in particular, top layer 16 and/or contact layer 14, to one or more other components in a circuit. However, it is understood that the configuration of raised portions 14A, 16A is only illustrative of various types of configurations possible for heterostructure 10.

Figure 2:
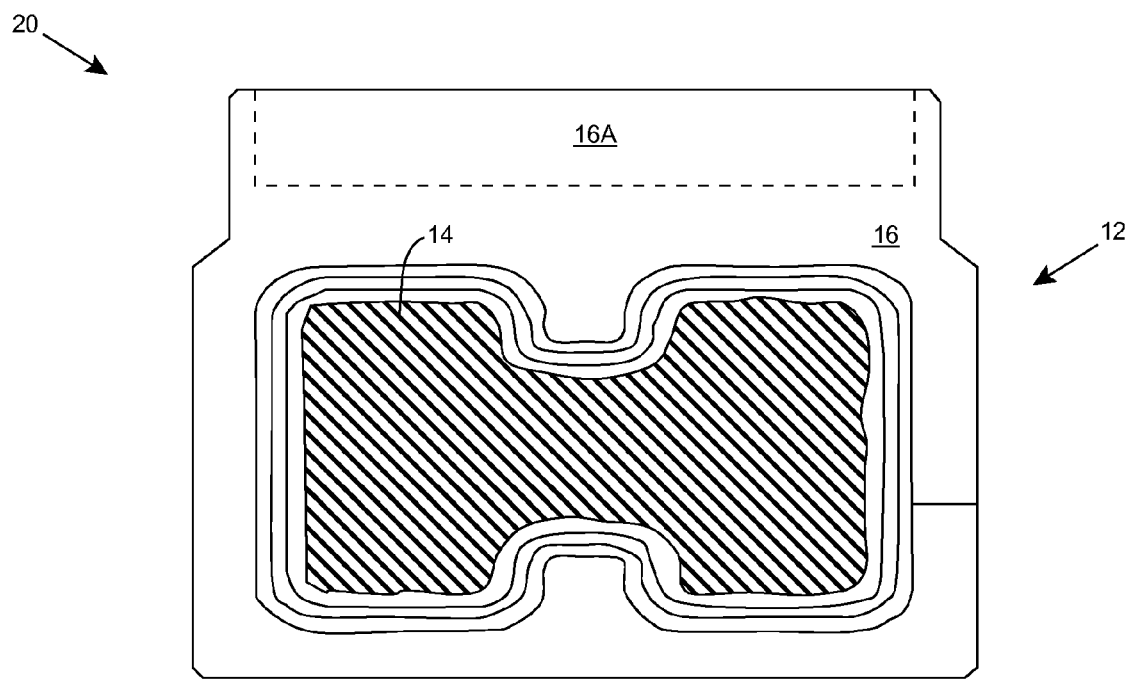
FIG. 2 shows another illustrative light emitting heterostructure 20 according to an embodiment of the invention.

FIG. 2 shows another illustrative light emitting heterostructure 20 according to an embodiment of the invention. Similar to heterostructure 10 (FIG. 1), light emitting heterostructure 20 includes a light generating structure 12 having a top layer 16 and a contact layer 14 disposed on top layer 16. However, in heterostructure 20, light generating structure 12 has a substantially rectangular shape and contact layer 14 has an H-shape. The configuration of heterostructure 20 provides several advantages over previous rectangular shaped light emitting heterostructures and/or devices. For example, the H-shape of contact layer 14 provides for a reduced current crowding, an efficient packaging, an acceptable (e.g., near circular) beam shape for the emitted light, and/or the like.

To this extent, unlike an interdigitated finger-type of pattern, the H-shape of contact layer 14 allows for a better utilization of the area of heterostructure 20. For example, a ratio of junction area for contact layer 14 to a total area used for contact layer 14 can be approximately 0.85 as compared to a ratio of approximately 0.5 for the interdigitated finger-type patterns. Additionally, contact layer 14 makes a solid contact base, thereby improving thermal and current management, optical beam shaping, reducing current density, improving an operating lifetime, and/or the like, over other previous approaches.

Further, contact layer 14 can be configured in a manner to reduce requirements for precise alignment during chip fabrication and/or packaging processes. For example, in a batch process during the wafer production stage, the entire contact layer 14 can be elevated (as indicated by several gradient lines) to provide a relatively large contact bump as compared to the overall heterostructure 20 size. Similarly, top layer 16 can include a raised portion 16A (as indicated by dashed line) to provide a large contact area for top layer 16.

In any event, the H-shape of contact layer 14 includes a substantially rectangular central portion that connects two substantially parallel fingers, each of which extends above and below the central portion. Each finger can comprise a substantially rectangular shape of a similar size, thereby making contact layer 14 substantially symmetrical about two axes. In an embodiment of the invention, a width of the central portion and a width of each finger are between 0.1 and 0.5 current crowding lengths for heterostructure 20. To this extent, a contact pad can be attached to both fingers and/or the central portion of contact layer 14.

However, it is understood that one or both fingers can be deformed using any solution. For example, one or both ends of a finger can be deformed to assist in attaching a metal extension to contact layer 14, e.g., for providing a contact, heat removal, and/or the like. To this extent, a contact pad can be attached to one of the fingers. In this case, the finger configured to attach to the contact pad can have a width that is between 0.1 and 0.3 current crowding lengths wider than the other finger. Further, one or more corners of at least one finger can be smoothed to an arc shape to reduce an excessive electrical field, provide a more uniform field and/or current density distribution over contact layer 14, and/or the like.

Figure 3:
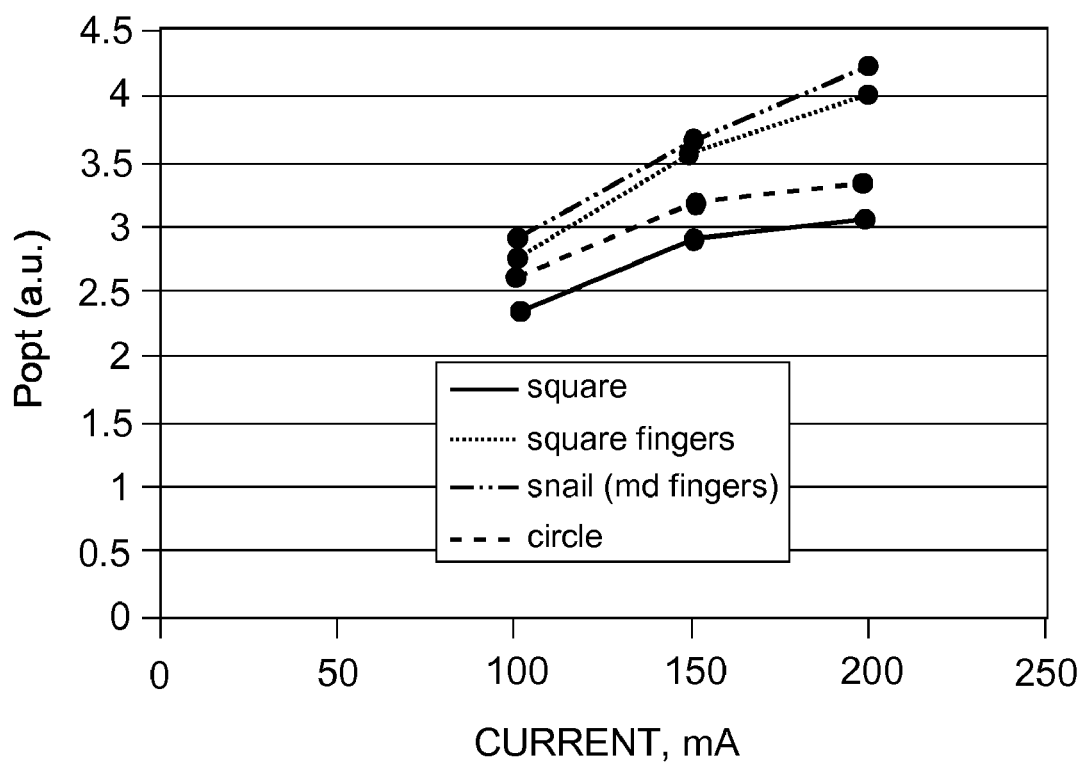
FIG. 3 shows a chart of power-current characteristics for illustrative 340 nanometer light emitting devices having different contact geometries.

FIG. 3 shows a chart of power-current characteristics for illustrative 340 nanometer light emitting devices (LEDs) having different contact geometries. As illustrated, the operating characteristics for the LEDs varied significantly based on the contact geometry used. Similarly, FIG. 4 shows a chart of power-current density characteristics for illustrative light emitting devices having different contact geometries. As clearly shown in FIG. 4, the H-shape contact geometry provided far superior optical output power for comparable current density than other commonly used contact geometries.

In any event, contact layers 14 (FIGS. 1 and 2) can form ohmic contacts that have improved operating characteristics. To this extent, heterostructures 10, 20 (FIGS. 1 and 2) can limit current crowding by the clover shape or H-shape, respectively, of the junctions between contact layer 14 (e.g., a p-type layer) and top layer 16 (e.g., an n-type layer). In particular, a lateral resistance of heterostructures 10, 20 can be reduced by making a maximum distance from any location in contact layer 14 less than or equal to one half of a characteristic current crowding length for heterostructure 10, 20. For a regular rectangular shaped device or an elliptical/circular shaped device, the characteristic current crowding length is approximately the minimum diameter divided by two.

Additionally, light generating structures 12 (FIGS. 1 and 2) can comprise any combination of one or more layers that are configured to generate and/or emit light. To this extent, light generating structure 12 can include a substrate, an active layer, an active structure (e.g., an alternating series of quantum wells and barrier layers), and/or one or more layers that actively or passively contribute to the operating properties of light generating structure 12, such as blocking, supply (e.g., hole and/or electron), reflecting, dielectric, strain-relief, and/or the like.

In an embodiment of the invention, light generating structure 12 (FIGS. 1 and 2) comprises a nitride-based heterostructure. For example, light generating structure 12 can include any type of substrate that includes one or more layers disposed thereon. Each layer in light generating structure 12 can comprise a group-III nitride composition, such as a composition selected from $Al_XGa_YIn_ZN$, where $0 \leq X, Y, Z \leq 1$, and $X+Y+Z=1$, a dielectric (e.g., silicon dioxide, silicon nitride, and/or the like), etc. Additionally, contact layer 14 (FIGS. 1 and 2) can comprise a group-III nitride composition, such as a composition selected from $Al_XGa_YIn_ZN$, where $0 \leq X, Y, Z \leq 1$, and $X+Y+Z=1$. In one embodiment, contact layer comprises AlGaN. Regardless, it is understood that each layer in light generating structure 12 and contact layer 14 can comprise a substantially uniform composition or have a composition that is graded in a direction substantially perpendicular to one or more adjacent layers.

Heterostructures 10, 20 can be configured to operate as any type of light emitting device, such as a light emitting diode or laser. Further, heterostructures 10, 20 can generate and/or emit light having any set of properties that are capable of being generated using any solution. In an illustrative embodiment of the invention, heterostructure 10 and/or 20 generates and emits light (coherent or non-coherent) having a wavelength in at least one of: the blue spectrum or the deep ultraviolet (UV) spectrum. However, it is understood that aspects of the invention apply equally to heterostructures 10, 20 configured to emit radiation in any portion of the visible and/or non-visible spectrums.

While aspects of the invention relating to heterostructures 10, 20 and the corresponding devices have been shown and described herein, it is understood that the invention provided various alternative embodiments. For example, an embodiment of the invention provides a method of manufacturing a heterostructure 10, 20. In this case, a light generating structure 12 (FIGS. 1 and 2) can be obtained using any solution. For example, light generating structure 12 can be purchased and/or manufactured using any solution. Additionally, light generating structure 12 can undergo any type of pre-processing necessary for further manufacturing. In any event, contact layer 14 (FIGS. 1 and 2) can be formed on light generating structure 12 using any solution. For example, contact layer 14 can be grown/deposited on light generating structure 12. Additionally, contact layer 14 can be shaped using any solution, such as masks, and/or the like. To this extent, the formation of contact layer 14 may include the growth/depositing and subsequent removal of one or more temporary layers using any solution.

Further, an embodiment of the invention provides a method of manufacturing a device and/or circuit that includes heterostructure 10 and/or 20 using any solution. To this extent, heterostructure 10, 20 can be obtained and/or manufactured as discussed herein, and further processing can be performed to generate a device. For example, one or more contacts, contact pads, metal extensions, and/or the like can be attached, the device can be packaged (e.g., flip chip packaged), the device can be included in a chip being manufactured, and/or the like, using any solution.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A light emitting heterostructure comprising:
  a light generating structure including a top layer, wherein a first portion of the top layer is configured to be directly connected to at least one other component in a circuit; and
  a contact layer directly on a second portion of the top layer distinct from the first portion, the contact layer having a contact shape comprising one of: a clover shape with at least a third order axis of symmetry, wherein the contact shape is formed by a plurality of fingers, and wherein each finger of the clover shape contact comprises an increasing finger width as the finger extends from a central portion of the contact layer.

2. The heterostructure of claim 1, the light generating structure having a substantially circular shape.

3. The heterostructure of claim 1, the light generating structure having a rectangular shape.

4. The heterostructure of claim 1, the contact shape being deformed.

5. The heterostructure of claim 4, wherein at least one finger of the contact shape is deformed.

6. The heterostructure of claim 5, further comprising a metal extension attached to the at least one finger.

7. The heterostructure of claim 6, the metal extension providing at least one of: a contact or heat removal.

8. The heterostructure of claim 1, wherein a distance from any location in the contact layer to a surface of the light generating structure is less than one half of a characteristic current crowding length.

9. The heterostructure of claim 1, wherein the contact layer comprises a p-type contact layer.

10. The heterostructure of claim 1, wherein the light generating structure comprises a nitride-based heterostructure and the contact layer comprises AlGaN.

11. A light emitting device comprising:
a light generating structure including a top layer having a first portion; and
a contact layer directly on a second portion of the top layer distinct from the first portion, the contact layer having a clover shape with an axis of symmetry of at least the third order, wherein the clover shape is formed by a plurality of fingers, wherein each finger comprises an increasing finger width as the finger extends from a central portion of the contact layer, and wherein the device is configured to be directly connected to at least one other component in a circuit using the first portion of the top layer and the contact layer.

12. The device of claim 11, wherein the light generating structure comprises a nitride-based heterostructure and the contact layer comprises AlGaN.

13. The device of claim 11, the axis of symmetry comprising the fifth order.

14. The device of claim 11, at least one of the plurality of fingers being deformed.

15. The device of claim 14, further comprising at least one of: a contact or a heat sink attached to the at least one of the plurality of fingers.

16. The device of claim 11, the light generating structure configured to emit light having a wavelength in at least one of: the blue spectrum or the deep ultraviolet (UV) spectrum.

* * * * *